United States Patent
Philippe

(10) Patent No.: US 10,216,336 B2
(45) Date of Patent: Feb. 26, 2019

(54) CONTROL DEVICE AND ELECTRONIC DEVICE COMPRISING SAME

(71) Applicant: NEXYS, Paris (FR)

(72) Inventor: Sébastien Philippe, Nimes (FR)

(73) Assignee: NEXYS, Paris (FR)

(*) Notice: Subject to any disclaimer, the term of this patent is extended or adjusted under 35 U.S.C. 154(b) by 176 days.

(21) Appl. No.: 14/817,146

(22) Filed: Aug. 3, 2015

(65) Prior Publication Data

US 2015/0338997 A1   Nov. 26, 2015

Related U.S. Application Data

(63) Continuation-in-part of application No. 13/574,258, filed as application No. PCT/FR2011/050109 on Jan. 20, 2011.

(30) Foreign Application Priority Data

Jan. 20, 2010  (FR) ...................... 10 00210

(51) Int. Cl.
*G06F 3/042*   (2006.01)
*G06F 3/041*   (2006.01)
*H03K 17/96*   (2006.01)

(52) U.S. Cl.
CPC .......... *G06F 3/0421* (2013.01); *G06F 3/0416* (2013.01); *H03K 17/9629* (2013.01); *H03K 17/9631* (2013.01); *G06F 2203/04108* (2013.01)

(58) Field of Classification Search
CPC .... G06F 3/0421; G06F 3/0426; G06F 3/0428; G06F 3/04886; H03K 17/941;

(Continued)

(56) References Cited

U.S. PATENT DOCUMENTS 3,764,813 A * 10/1973 Clement .............. G01B 11/002
                                                  250/221
6,677,934 B1 * 1/2004 Blanchard ............. G06F 3/0421
                                                  250/221
(Continued)

FOREIGN PATENT DOCUMENTS

DE    202005004687 U1   1/2006
EP         1633047 A2   8/2006
GB         2161266 A1   1/1986

*Primary Examiner* — Kumar Patel
*Assistant Examiner* — Amen Bogale
(74) *Attorney, Agent, or Firm* — PatShegen IP; Eva Taksel

(57) ABSTRACT

The control device comprises at least one emitter-receiver pair, a display and a controller. The emitter-receiver pair comprises a radiation emitter and a receiver for receiving radiation emitted by the emitter and reflected by a moving body located at a distance from the pair. The receiver is positioned within the emitter's emission field and provides an electrical signal representative of the radiation received from the emitter. At least one symbol identifying an action, opposite an intersection of the emitter's emission cone and the receiver's reception cone, is displayed. The emitter and receiver are outside the display area of each symbol. The controller provides action control signal according to the electrical signal provided by the receiver. Each emitter-receiver pair is associated with at least one symbol and at least one action control signal when the moving body is in front of the symbol that identifies the action.

13 Claims, 11 Drawing Sheets

(58) Field of Classification Search
CPC ....... H03K 17/943; H03K 2217/94108; H03K 2217/94111; H03K 2217/94112
See application file for complete search history.

(56) References Cited

U.S. PATENT DOCUMENTS

| | | | |
|---|---|---|---|
| 7,656,391 B2 | 2/2010 | Kimura et al. | |
| 2003/0111588 A1* | 6/2003 | Chen .................... | G06F 3/0421 250/208.1 |
| 2004/0246105 A1* | 12/2004 | Cavallucci ........... | H03K 17/943 340/286.01 |
| 2007/0165008 A1* | 7/2007 | Crockett ............... | G06F 3/0421 345/175 |
| 2008/0055494 A1 | 3/2008 | Cernasov | |
| 2008/0167834 A1* | 7/2008 | Herz .................... | G06F 1/3203 702/150 |
| 2009/0002340 A1* | 1/2009 | Van Genechten .... | G06F 3/0421 345/175 |
| 2009/0091554 A1* | 4/2009 | Keam .................. | G06F 3/0421 345/175 |
| 2009/0225058 A1 | 9/2009 | Tateuchi et al. | |
| 2010/0271331 A1* | 10/2010 | Alameh ................ | G06F 3/0421 345/175 |
| 2012/0050228 A1* | 3/2012 | Choi .................... | G06F 3/0421 345/175 |

\* cited by examiner

CONTROL DEVICE AND ELECTRONIC DEVICE COMPRISING SAME

RELATED APPLICATIONS

This application is a continuation-in-part of application Ser. No. 13/574,258 filed Aug. 23, 2012, which is a § 371 application from PCT/FR2011/050109 filed Jan. 20, 2011, which claims priority from French Patent Application No. 10 00210 filed Jan. 20, 2010, each of which is incorporated herein by reference in its entirety.

TECHNICAL FILED OF THE INVENTION

This invention concerns a control device and electronic device comprising same. It applies, in particular, to human-machine interfaces, switches, potentiometers and voltage or current regulators actuated by the user's hand or finger passing at a distance.

More specifically, the control device that is the subject of this invention allows an electronic device to be controlled or the rate of flow of an energy source (electricity, water, gas, heat, etc.) to be changed by passing a moving object (for example a hand, etc) in front of this regulator. This invention can be used, for example, with media players/recorders (e.g. music, still images or video), with lamps or any other lighting systems (e.g. in dimmers), with automated roller blinds (e.g. for the actuator contact), with water or gas faucets (regulating the flow rate of water), with radiators or other heating devices (e.g. thermostats), with ventilation systems (e.g. air conditioners, fans) and with elevator floor selectors, remote controls or keyboards.

BACKGROUND OF THE INVENTION

The use of linear or rotary potentiometers, switches, regulators or dimmers and buttons for lighting systems or mechanical faucets in water or gas flow control systems, all actuated manually, is known. However, the lifespan of these mechanical pieces of equipment is limited because they have mechanical moving parts that deteriorate through wear of the mechanical parts.

Touch-screen interfaces, in which a user touches a screen to control functions, are also known. However, the sensitivity of these screens varies and the successive presses cause wear.

In addition, actuating these pieces of mechanical equipment manually or pressing a touch-screen causes unsightly marks and, over time, soiling to build up. Lastly, mechanical equipment and touch-screens have drawbacks in terms of hygiene and contamination risks, particularly when in collective use.

OBJECT AND SUMMARY OF THE INVENTION

The aim of this invention is to remedy these drawbacks.

To this end, this invention envisages, firstly, a control device that comprises at least one emitter-receiver pair, made of a radiation emitter and a radiation receiver for the radiation emitted by said emitter, which radiation is reflected by a moving body, placed away from the pair, within the emissions field of said emitter; said receiver is separate from said emitter and designed to supply an electrical signal that represents the radiation it receives from the emitter, characterized in that it comprises, in addition:

a display means designed, for at least one pair, to display at least one symbol that identifies an action, opposite an intersection of said emitter's emission cone with the reception cone of said receiver, with said emitter and said receiver being thus outside the display area of each symbol and a means of control designed to provide action instruction signals depending on the electrical signal provided by at least one said receiver; each emitter-receiver pair is thus associated with at least one symbol and at least one action instruction when the moving body is in front of the symbol that identifies said action.

Because of these provisions, to instruct an action, e.g. play media, pause replay, fast forward or rewind, stop, users need only point their finger in the direction of the symbol that identifies that action, without having to touch the control device.

Because there is no contact with the control device that is the subject of this invention, its ergonomics can be improved in relation to devices of the previous state of the art. In adaptive variants, i.e. which can be parameterized by installers, users or software, these ergonomics can also, for example, depend on the actions available when the device is in a given state. For example, the range, the duration required to trigger an action and the movements triggering an action can be adjusted during or after installation, at the user's request or with software.

Because there are no mechanical parts operated by the user, the reliability and service life of the control device can be higher than those of devices of the prior state of the art.

The control device that is the subject of this invention also avoids handling, particularly in the following environments:
damp: bathrooms, outdoor areas, immersion, wherever there are risks of electrocution;
dirty: industry, public spaces (transport, elevators);
clean: hospitals, agri-food industries, public spaces.

The implementation of the control device that is the subject of this invention also reduces the risk of vandalism, since the control device can be armored or hidden, as well as soiling and contamination risks.

According to particular features, the display means is designed to display at least one symbol per light emission. Thanks to these provisions, the displayed symbol is more visible, in particular under low ambient light conditions.

According to particular features, the display means is designed to display at least one symbol on a screen. Thanks to these provisions, different symbols or different colors or contrasts of a single symbol can be displayed by a single display means.

It should be noted that the display means can also display at least one printed, silk-screened, engraved or mass dyed symbol.

According to particular features, the display area of at least one symbol is surrounded by at least three emitters and/or receivers; the line segments connecting each emitter to each receiver overlap an area for displaying a symbol.

Thus, this invention makes it possible to make a touch-screen that functions with no contact between the user's finger and the screen; this has advantages over traditional touch-screens. It should be noted that by using pulsed light sources and means of recognizing the emitted pulses, a matrix touch-screen can be made that is able to discern a number of touch areas equal to the product of the number of emitters by the number of receivers, with these emitters and receivers located around the screen.

According to particular features, the control means comprises a means of processing designed to eliminate the impact of ambient light not reflected by the reflecting moving object.

Thanks to these provisions, the device that is the subject of this invention can then be used even when the ambient radiation is of the same order of magnitude as, or even greater than, the radiation reflected by the moving body in the direction of the receiver.

According to particular features, at least one emitter of radiation is designed to emit radiation in an intermittent manner and the means of processing are designed to store an electrical signal level sent by each receiver when the radiation emitter is not emitting any radiation; the action control signals depend on the instantaneous radiation received and on the stored level.

According to particular features, at least one emitter of radiation is designed to emit radiation in an intermittent manner and the means of processing are designed to extrapolate an electrical signal level sent by each receiver when the radiation emitter is not emitting any radiation; the action control signals depend on the instantaneous radiation received and on the extrapolated level.

Because of each of these provisions, the means of processing can take the current ambient radiation received by each receiver into account and determine, for each receiver, the radiation received after being reflected onto the reflecting moving object, which increases the accuracy with which its presence is determined.

According to particular features, at least one radiation emitter or receiver is associated with at least one mask, whose transparent portion for at least one wavelength used by the emitter, is elongated in the direction of a receiver able to detect light of said wavelength.

Because of these provisions, parasite signals are reduced significantly.

According to particular features, the control means is designed to provide an output signal modulated according to the magnitude of the stimulus.

According to particular features, the control device described in brief above comprises a communication means to receive or send commands remotely.

Because of these provisions, the control device can communicate with actuators, external electronic circuits or peer control devices.

According to particular features, in at least one emitter-receiver pair, the axes of the emitter and of the receiver are convergent. The inventor has discovered that this layout increases the sensitivity of the control device, while reducing the incidence of the ambient parasites and light noise.

According to particular features, the display means is designed to display, for at least one pair, at least one symbol identifying an action; an axis perpendicular to a plane bears said symbol and rests within the convex area defined by the intersection of said symbol with the emission axis of said emitter and/or the reception axis of said receiver.

According to particular features, when a finger is placed in contact with the symbol display area, it is not detected as this object does not at that time reflect any radiation emitted by an emitter in the direction of a radiation receiver. In this way, the risk of a user's finger touching and possibly soiling the surface of the device is reduced.

This invention envisages, secondly, an electronic device designed to execute actions, characterized in that it comprises a control device, the subject of this invention, which controls at least one said action.

This invention envisages, secondly, a control method with a device comprising at least one emitter/receiver pair, made up of a radiation emitter and of a receiver for the radiation emitted by said emitter, which radiation is reflected by a moving body located at a distance from the pair, within the emission field of said emitter and designed to provide an electrical signal that represents the radiation received from the emitter, characterized in that it comprises, in addition:

- a display step, for at least one pair, of at least one symbol that identifies an action, opposite an intersection of said emitter's emission cone with the reception cone of said receiver, with said emitter and said receiver being thus outside the display area of each symbol and
- a control step that provides action instruction signals depending on the electrical signal provided by at least one said receiver; each emitter-receiver pair is thus associated with at least one symbol and at least one action instruction when the moving body is in front of the symbol that identifies said action.

As the particular characteristics, advantages and aims of this electronic device and of this method are similar to those of the control device that is the subject of this invention, as described in brief above, they are not repeated here.

BRIEF DESCRIPTION OF THE DRAWINGS

Other advantages, aims and characteristics of the present invention will become apparent from the description that follows, which is made as an example that is in no way limiting, with reference to the drawings included in an appendix, in which.

DETAILED DESCRIPTION OF THE EMBODIMENTS

Throughout the whole description, it is the utilization of infrared light radiation that is described. However, this invention is not restricted to this type of radiation but, on the contrary, extends to sound radiation, ultrasound in particular, and to electrical fields in order to determine a variation in inductance.

Figure 1:
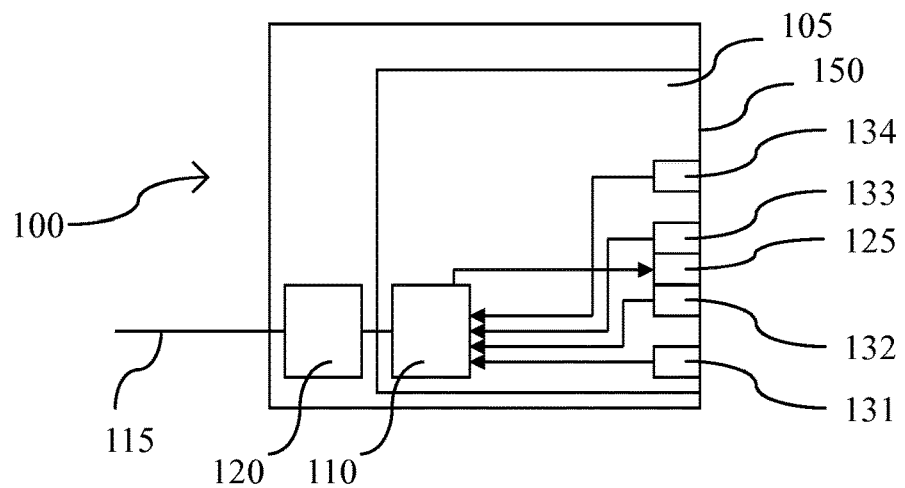
FIG. 1 represents, schematically, a first embodiment of the control device that is the subject of this invention.

An electronic device 100 can be seen in FIG. 1, which comprises a control device 105, a microprocessor 110, a mains power cord 115, an energy source 120 and a display means 150.

The control device 105 comprises the infrared emitter 125 and four infrared receivers 131 to 134. The four emitter-receiver pairs (125-131, 125-132, 125-133 and 125-134) are constituted in this way, made up of the radiation emitter 125 and of one of the receivers that receive the radiation emitted by the emitter and reflected by a moving body located away from the pair, within the emission field of the emitter 125. It should be noted that, in each pair, the receiver is separate from said emitter and designed to supply an electrical signal that represents the radiation it receives from the emitter.

The energy source 120 is, for example, a battery, an accumulator, a photovoltaic sensor or a transformer connected to the electrical network, or a circuit based on a Zener diode connected to the electrical network or a switching regulator.

Figure 2A:
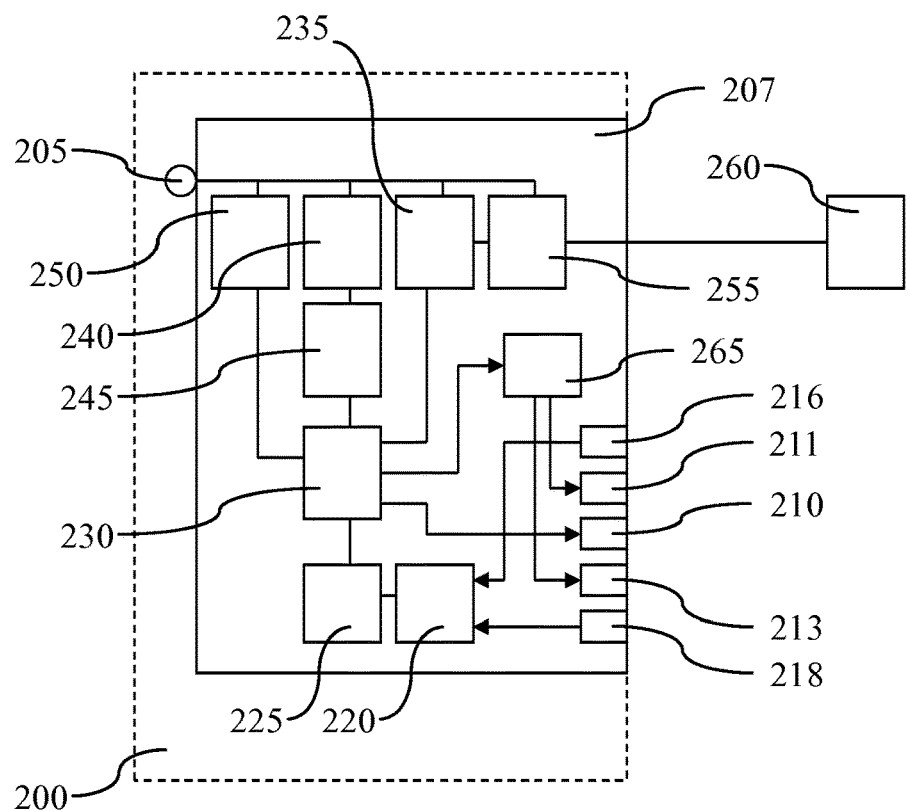
FIGS. 2A and 2B represent, schematically, in a front cross-section view, a second embodiment of the control device that is the subject of this invention.
Figure 2B:
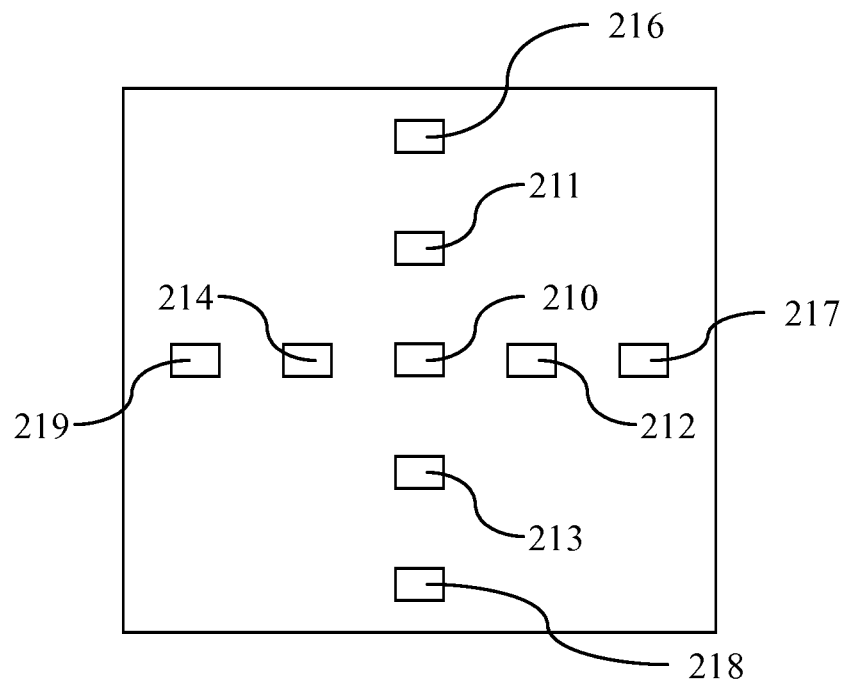

The infrared emitter 125 and the infrared receivers 131 to 134 operate as explained with regard to FIGS. 2A and 2B for the infrared emitter 210 and the four infrared receivers 216 to 219, respectively. The microprocessor 110 comprises logic inputs that change the electrical signal levels it receives from the infrared receivers 131 to 134 into a logic voltage level.

The reference level is a level determined during manufacture or installation, which represents the absence of any moving object reflecting infrared at a predefined distance, e.g. a finger placed three centimeters from receivers 131 to 134, in the emission field of emitter 125.

For each emitter/receiver pair, a display means 150 is designed to display at least one symbol (211 to 214 in FIG. 2B) that identifies an action, half-way between the emitter and the receiver. For example, each symbol is made by silk-printing on a transparent sheet, e.g. made of plastic, which covers the emitter 125 and receivers 131 to 134. In a preferred embodiment, each symbol is back-lit, for example by a light-emitting diode ("LED"). In embodiments, each light is controlled as to intensity and/or color by the microprocessor 110.

The microprocessor 110 makes up a means of control designed to provide action instruction signals depending on the electrical signal emitted by at least one said receiver. Each emitter-receiver pair is thus associated with at least one symbol displayed by the display means 150 and at least one action requested by the microprocessor when the moving body is in front of the symbol that identifies said action.

It can be seen that in a variant, a single emitter, a single symbol and a single receiver, possibly combined into a single emitter/receiver/symbol component, makes it possible to realize a control button or switch with two stable positions: each time a reflecting object passes in front of the displayed symbol, the button or switch changes positions.

FIGS. 2A and 2B show, built into an electronic device 200 (partially represented by broken lines) and connected to mains power supply cables 205 (the sheath of which is seen in cross-section in FIG. 2A), a control device 207 comprising an infrared emitter 210, four infrared receivers 216 to 219, a multiplexer 220, a digitizer 225, a controller 230, a synchronization module 235, a transformer 240, a regulator 245, a modem 250 and a power module 255 connected to an electrical load 260.

The infrared emitter 210 is, for example, a light-emitting diode having a wide angle of emission, e.g. 120°. Its emissions are controlled by the controller 230. The four infrared receivers 216 to 219 are photodiodes, phototransistors or photoresistors of know type. In this embodiment, they are located on a vertical line (emitters 216 and 218) and on a horizontal line (217 and 219) at regular intervals, with these lines intersecting at the position of the infrared emitter 210. Their outputs are connected to the input of the multiplexer 220, which is controlled by the controller 230 and which supplies the output signals from the infrared receivers 216 to 219 to the digitizer 225, in sequence.

The digitizer 225 receives the signals output from the multiplexer 220 and provides a digitized signal to the controller 230. The controller 230, which comprises a clock, random-access memory and read-only memory (not shown), is of known type. It utilizes a program stored in its read-only memory to implement the logical diagram shown in FIG. 4.

The synchronization module 235 supplies a signal to the controller 230 that indicates, firstly, the passage of the electrical network voltage at zero and actuates the output from the power module 255.

The power module 255, which performs the distribution of the energy according to a command given by the controller 230, is made by means of either a dimmer circuit (fitted with a triac and its control connected to a pulse width modulated—PWM—output signal) or transistors, or relays, or potentiometers to control the energy flow while dissipating the power without causing damage to these same components, or by means of a stepping motor controlling a potentiometer.

In the case of a dimmer circuit, it is possible to actuate this last via the PWM (Pulse Width Modulation) signal of the controller 230 and by means of a triac control component (detecting mains zero for synchronization) galvanically isolating (by optical means, e.g. optocouplers) the control circuit's power circuit.

The transformer 240 and regulator 245 provide DC voltage to the controller 230 and to the other components requiring a DC power supply. The transformer 240 reduces the alternating voltage and the regulator 245 transforms the alternating voltage into a regulated DC voltage.

The modem 250 is connected to the controller 230 and to the mains and utilizes carrier wave signals so that the controller 230 communicates with other controllers communicating by carrier wave. In a variant, the modem 250 is connected to an infrared or radio emitter-receiver to communicate with other peer controllers.

Thanks to the multiplexer 220 and to the digitizer 225, the controller has digital values for the light intensities received by the infrared receivers 216 to 219, including the light intensities of the rays emitted by the infrared emitter 210 and reflected by the objects located in front of this emitter and receivers, i.e. within their fields of emission or reception, respectively.

The controller 230 actuates the intermittent switching on of the emitter 210 synchronized with the multiplexer 220, so as to obtain in succession the digital values for the infrared light intensities received by the receivers 216 to 219, when the emitter 210 is switched off, and these digital values when the emitter 210 is switched on.

In variants, pulse width modulation (known by its acronym PWM) is used in order to modulate an emitted light signal likely to be recognized among the spurious signals.

By comparing the light intensities received when the emitter is switched on and when the emitter is switched off, the controller 230 eliminates the impact of ambient light, or noise, and determines the amount of light emitted by the receiver 210 that is reflected towards each receiver 216 to 219.

In a variant, so as to eliminate the impact of ambient light, the controller 230 subtracts from the values of the light intensities received by the receivers 216 to 219, their average values over a long length of time, for example five seconds, or their value extrapolated with an extrapolation function of a known type. In a variant, the signal is discriminated either by a threshold or by frequency, which makes it possible to know if the receiver is receiving the pulse-width modulation PWM from one receiver or from another, or from both.

In a variant, to compensate for the differences in exposure to the light emitted by the emitter 210, the controller 230 applies a multiplicator coefficient to the digitized light intensity values received by the receivers 216 to 219. These coefficients are, for example, the inverse of the light intensities measured by replacing the moving object by a white wall located at a predefined distance from the control device, e.g. 30 cm.

Then the controller 230 determines the position of a reflecting object located in front of the control device, according to the levels of the light intensities received by the receivers 216 to 219. For example, the controller 230 only determines the number of the receiver that receives the highest reflected light intensity as the position of the reflecting object. The position of the reflecting object determined by the controller 230 can therefore have as many values as there are receivers.

In a variant, the average value of the last measurement is used as the threshold value, to prevent using a threshold value that is obsolete because it was defined at start-up.

The controller 230 actuates the pulse width modulation power module, according to the position thus determined, taking into account the synchronization signal provided by the synchronization module 235.

Excluding phases during which the controller 230 determines whether a moving object is located opposite of the control device, the controller 230 takes into account the instructions that it receives from other control devices, via the modem 250.

For each emitter/receiver pair, the display means 265 is designed to display at least one symbol (211 to 214 in FIG. 2B) that identifies an action, between the emitter and the receiver. For example, each symbol is made by silk-printing on a transparent sheet, e.g. made of plastic, which covers the emitter 125 and receivers 131 to 134. In a preferred embodiment, each symbol is back-lit, for example by a light-emitting diode ("LED"). In embodiments, each light is controlled as to intensity and/or color by the microprocessor 110 according to the functions available at any given time.

Figure 3:
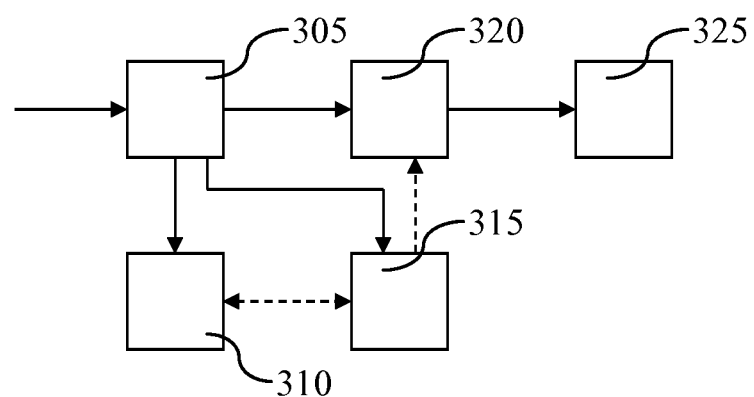
FIG. 3 represents, in a block-diagram, the operational assemblies of an electronic circuit incorporated in the embodiment of the control device shown in FIG. 2.

FIG. 3 shows the operational assemblies of the control device shown in FIGS. 2A and 2B. In this FIG. 3, the arrows with dotted lines represent the information flows and the arrows with solid lines represent the energy flows. FIG. 3 shows a power supply 305, an optical module 310, a data processing module 315, a power module 320 and an electrical load 325.

As shown with regard to FIGS. 2A and 2B, the power supply 305 comprises, for example, a battery or a transformer connected to the electrical network. The optical module 310 comprises the infrared emitter 210 and the infrared receivers 216 to 219. The emission of infrared rays by the infrared emitter 210 is controlled by the data processing module 315 and the signals coming from the infrared receivers 216 to 219 are sent to the data processing module 315. The data processing module 315 determines whether an object, which is at least partially reflecting within the spectrum of emission and reception of infrared signals, e.g. a hand or a finger, is located in front of the optical module 310 and, if so, the location of this moving object. According to this information, the data processing module controls the electrical power supplied by the power module 320 to the electrical load 325.

Figure 4:
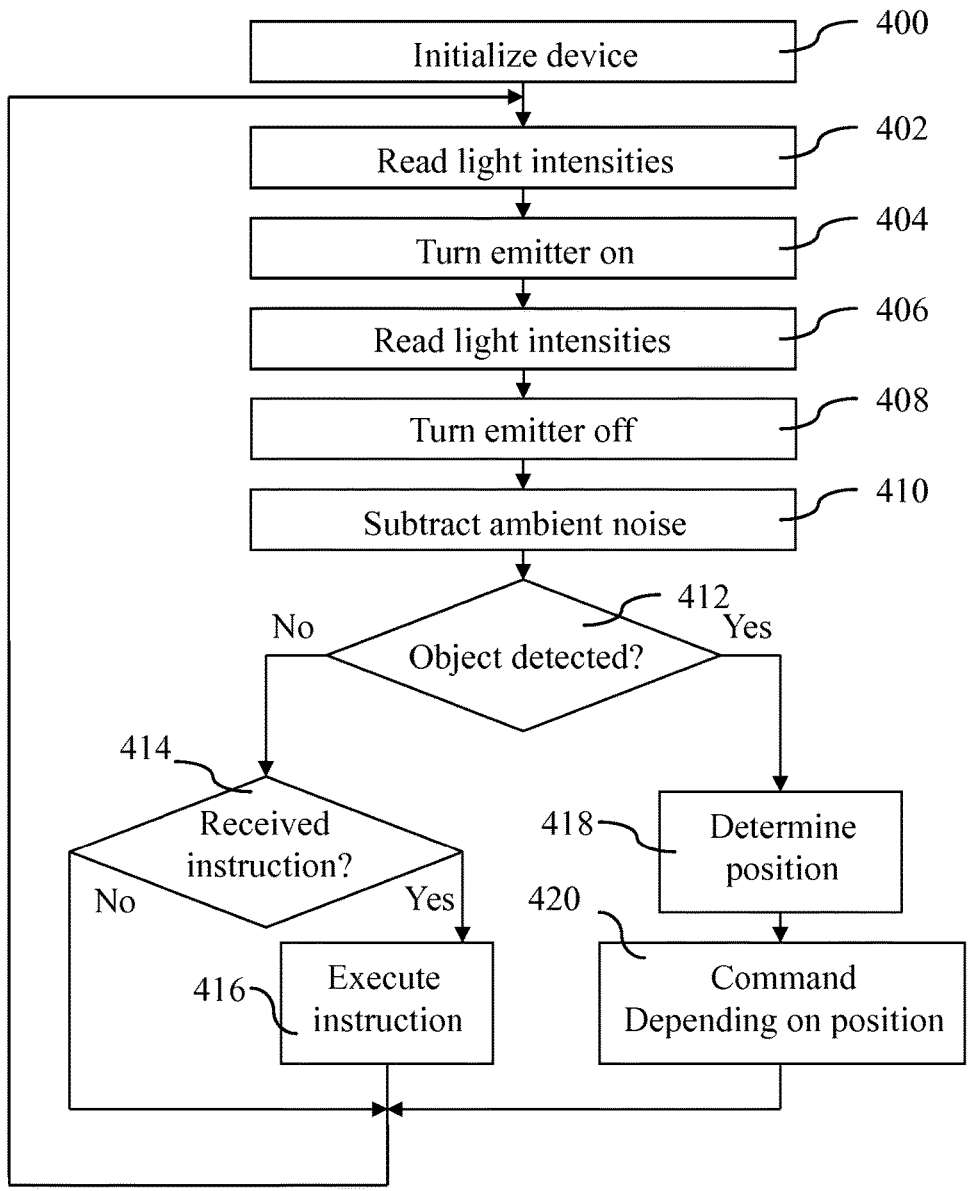
FIG. 4 represents a logical diagram of steps utilized by the control device shown in FIGS. 2 and 3.

FIG. 4 shows a step 400 of initializing the control device, then a step 402 of reading the light intensities received by the infrared receivers. During a step 404, the switching on of the emitter of infrared rays is requested. Then, during a step 406, the light intensities received by the infrared receivers are read. During a step 408, the infrared ray emitter is switched off to let this source cool down, to increase its lifespan and possibly to reduce electrical consumption. During a step 410, the values read during the step 402 are subtracted from the corresponding values read in step 406.

During a step 412, it is determined whether a reflection on an object opposite the control device has occurred by comparing the results of the subtractions to a threshold value. If all the results are below the threshold, it is determined whether a control instruction was received from another control device during a step 414. If no instruction was received, return to step 402. If an instruction was received, this instruction is executed, e.g. by instructing the power module, step 416, and by maintaining this instruction until another step 416 or a step 420; then return to step 402.

If at least one subtraction result is over the threshold, during a step 418, the position of the object in front of a symbol is determined and, during a step 420, a command is issued to the power module, depending on the symbol considered or on the position of the object, and this command is maintained until another step 420 or a step 416. Then return to step 402.

Figure 5:
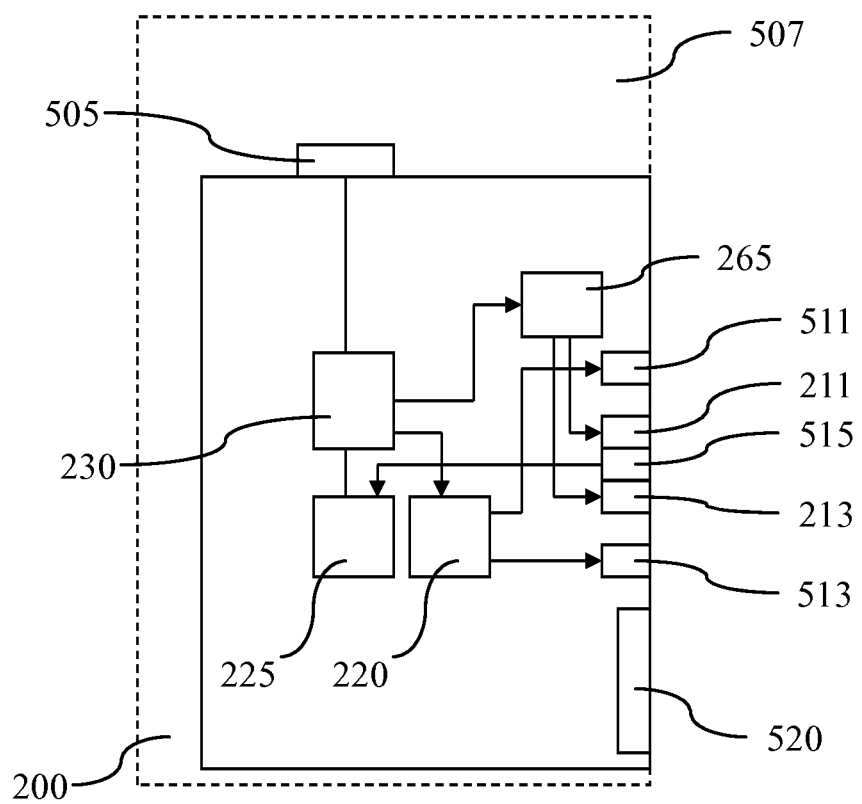
FIG. 5 represents, schematically, a third embodiment of the control device that is the subject of this invention.

In FIG. 5, a control device 507 can be seen, which comprises the same elements as the control device 207 illustrated in FIGS. 2A and 2B, with the following exceptions:
- the infrared emitter 210, which is replaced by four infrared emitters 511 to 514 (only emitters 511 and 513 can be seen in this cross-section view);
- the four infrared receivers 216 to 219, which are replaced by a single infrared receiver 515;
- the mains power cables 205, which are replaced by a connector 505; and those of:
- the synchronization module 235; the transformer 240; the regulator 245; the modem 250; the power module 255; and the electrical load 260, which are absent.

The commands sent by the control device 507 are transported by the connector 505 as well as the power supply for the control device 507.

The infrared emitters 511 to 514 present angles of emission that are in juxtaposition. The infrared receiver 515 presents a wide angle of reception, for example 120°. The control device operates as follows: the infrared emitters 511 to 514 are switched on in sequence, there being a phase in which all the emitters are switched off between two successive sequences of switching on the different infrared emitters.

The controller 230 determines the impact of ambient light and the position of a possible moving object located in front of one of the emitters, according to the light intensities successively received by the receiver 515, in a similar way to that described with respect to FIGS. 2A and 2B.

In this embodiment, a display 520 enables communication between the controller 230 and the user. For example, the controller 230 displays upon the display 520 messages representing the commands received by power line carrier, statuses or modes of operation of the electronic device.

It can be seen that the radial arrangement of the receivers shown in FIGS. 2A and 2B can take the form of a star with any number of radii. This radial arrangement with a central receiver can also be replaced by a polygonal arrangement, for example a square or hexagon, possibly completed with a central receiver or a second polygon incorporated within the first.

In variants, it is provided for each infrared receiver to be coupled to an infrared emitter by being integrated in a component performing both functions.

Hardware and/or software solutions can be applied in order to avoid unwanted actions being triggered (e.g., if all the sensors are "excited" at the same time, no action is ordered).

Figure 6:
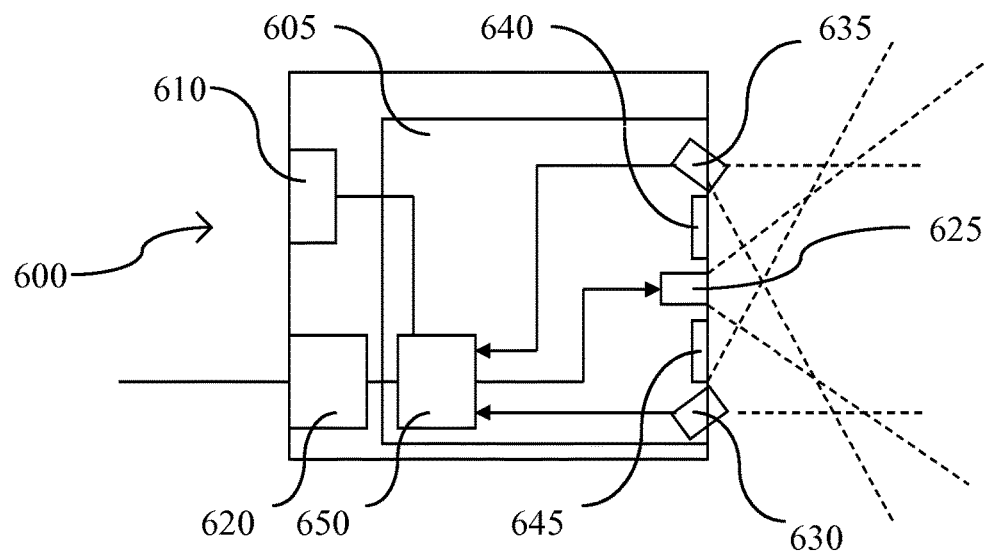
FIG. 6 represents, schematically and in cross-section, a third embodiment of the control device that is the subject of this invention.

FIG. 6 shows an electronic device 600 comprising a control device 605, a connector 610 and a power source 620.

The control device 605 comprises an infrared emitter 625, two infrared receivers 630 and 635 and a display comprising symbol carriers 640 and 645 and a controller 650. The symbols carried by the symbol carriers 640 and 645 correspond to the actions triggered in the electronic device 600 by the controller 650 via the connector 610 when a user's finger is located in front of that symbol. The presence of a finger is detected by the controller 650 according to the signals emitted by the infrared emitters 630 and 635, as described above.

In the embodiment shown in FIG. 6, the receivers 630 and 635 have axes pointing in the direction of the emitter 625. In the example illustrated in FIG. 6, the orientations of these axes are approximately 35° in relation to the axis of the emitter 625. The optical fields of the receivers are approximately 70° here, i.e. +/−35° in relation to their axis. Here, the emitter 625 has an optical field extending over approximately 150°.

These provisions are advantageous to increase the device's sensitivity at a distance corresponding to the convergence of the receivers' axes onto the emitter's axis and below this distance. In effect, a reflecting object placed between this plane and the plane of the front side of the device will reflect the light towards the receivers from a direction corresponding substantially to their maximum sensitivity.

The inventor has discovered that, all other things being equal, the respective inclination of the elements of an emitter-receiver pair makes it possible to increase its range and therefore the user's comfort of use and the tolerance to external parasites, noises and light sources.

To realize this respective inclination, experts can provide wedges made of non-conductive material or, more simply, slightly bend the tabs of the affected components, between these components and the electronic circuit they are mounted on.

This lesson, about the preferable respective inclination of the elements of the emitter-receiver pairs, is not limited to the case where there are only two such pairs but, on the contrary, extends to all of this invention's embodiments and, specifically to the particular embodiments illustrated opposite FIGS. 1 to 5.

Thus, preferably, the device that is the subject of this invention is designed to detect an object placed some distance away from the device and not to detect an object in contact with the device. This object does not then reflect any radiation in the direction of the radiation receiver. In this way, finger marks and the risk of soiling on the surface of the device are avoided.

Figure 10:
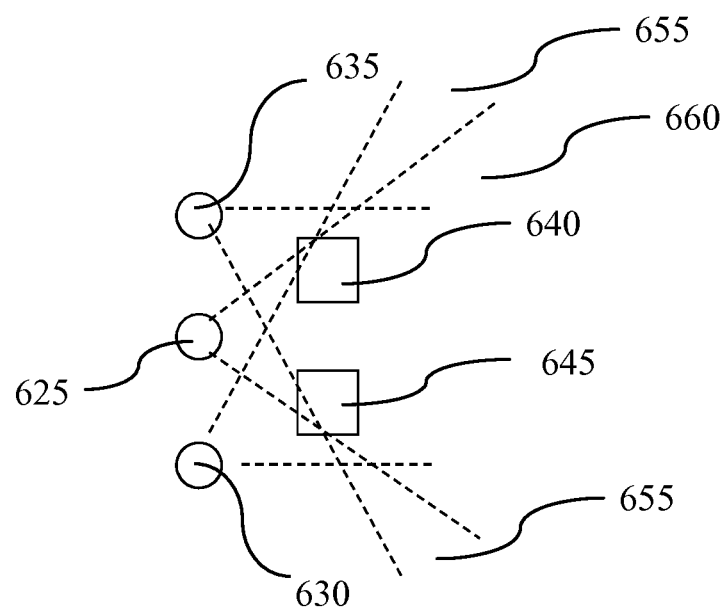
FIGS. 10 and 11 represent a variant of the fourth embodiment of the device illustrated in FIG. 6, along two other axes, which are perpendicular one to the other and to the axis of the cross-section illustrated in FIG. 6
Figure 11:
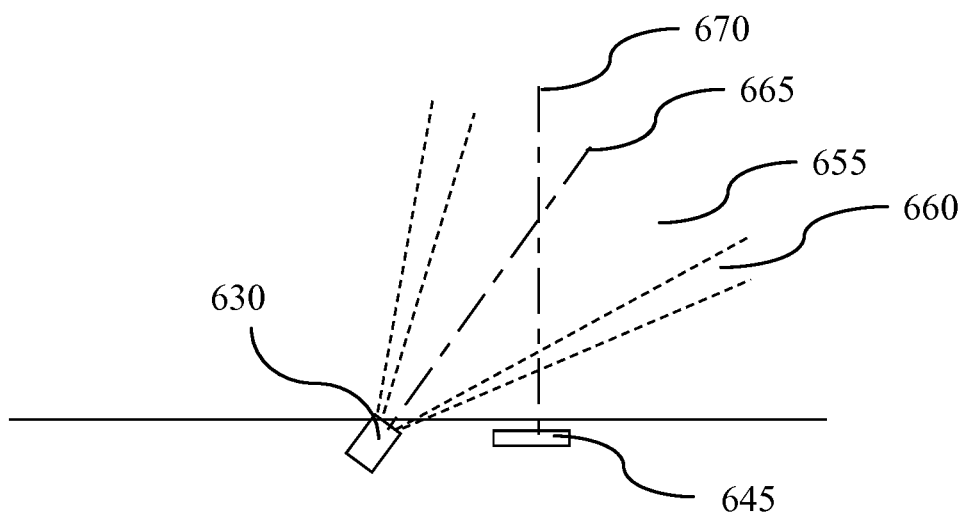

FIGS. 10 and 11 represent a variant of the fourth embodiment of the device illustrated in FIG. 6, along two other axes, which are perpendicular one to the other and to the axis of the cross-section illustrated in FIG. 6. FIG. 10 is a front view of the device, which therefore represents substantially what the user sees. FIG. 11 is a side cross-section view.

It can be seen in FIG. 10 that the means of displaying symbols 640 and 645 is designed, for each emitter-receiver pair 625 and 630, firstly and 625 and 635 secondly, to display the symbols 640 and 645 opposite an intersection between the emission cone 660 of the emitter 625 and the reception cone 655 of the receiver 630 or 635. The emitter and receiver are thus even more distant from each symbol's display area.

FIG. 11 shows the receiver 630, which hides the emitter 625 and the receiver 635 in this cross-section, and the display comprising symbol carriers 640 and 645, the first of which is hidden in this cross section by the symbol 640. Also shown in FIG. 11 are: the emission cones 660 of the emitter 625 and the reception cone 655 of the receiver 630; the axis 665 of the reception cone 655; an axis 670, perpendicular to a plane carrying said symbol, which rests within the convex area defined by said symbol. It should be remembered that a convex, in the mathematical sense, is a surface or a volume that comprises all the points located between two points of a figure, a symbol in this case. It can be seen that the axis 670, which is perpendicular to a plane carrying said symbol and resting within the convex area defined by said symbol, intersects with the reception axis 665 of the receiver 630. In other embodiments, an axis perpendicular to a plane carrying said symbol and resting in the convex area defined by said symbol intersects with the emission axis of an emitter or with both the emission axis of an emitter and the reception axis of a receiver.

Figure 7:
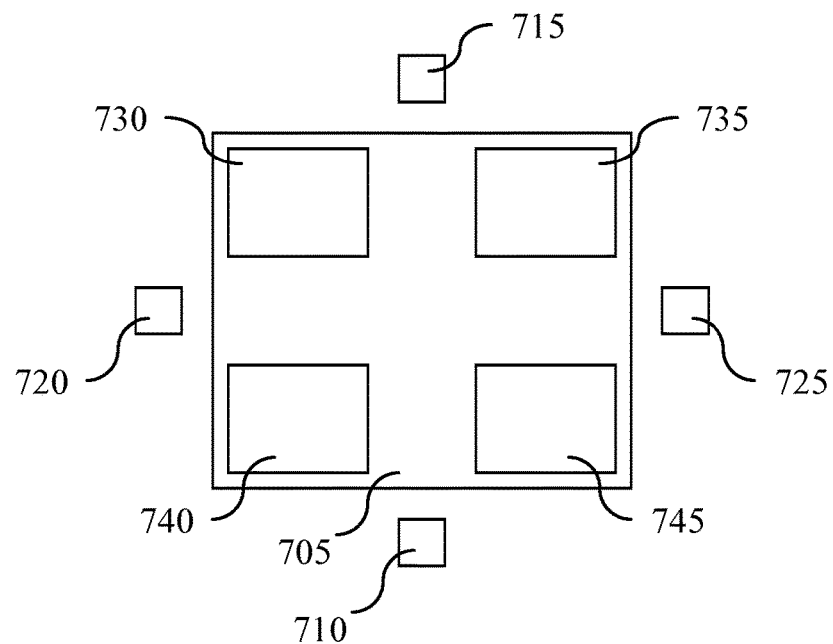
FIG. 7 represents, schematically and in a front view, a fifth embodiment of the control device that is the subject of this invention.

It can be seen in FIG. 7 that in the fifth embodiment of the control device that is the subject of this invention, a screen 705 is placed between a plurality of emitters 710 and 715 and a plurality of receivers 720 and 725. The screen 705 is designed to display symbols 730, 735, 740 and 745 either simultaneously or intermittently, e.g. depending on available commands in a given state of an electronic device comprising the control device illustrated in FIG. 7.

Figure 8:
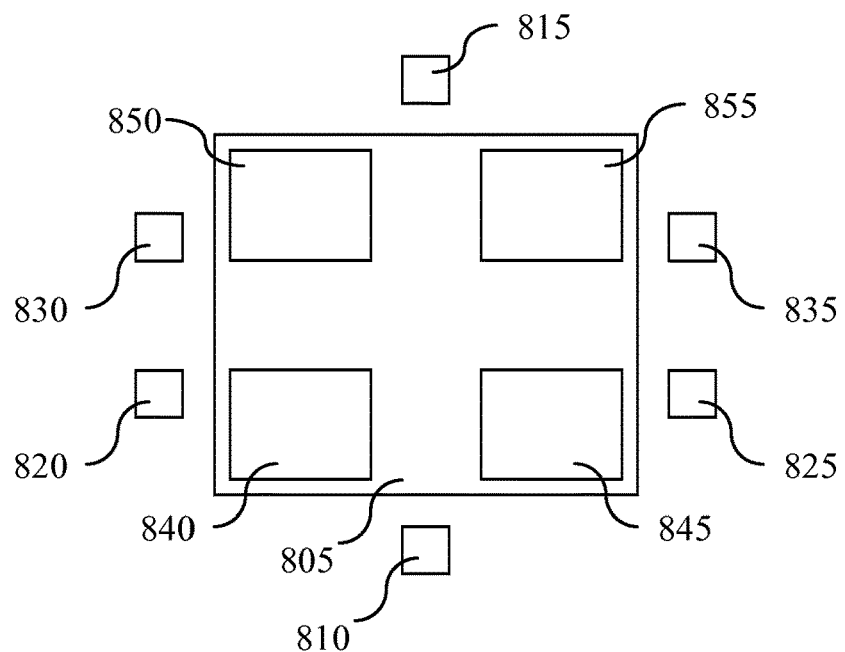
FIG. 8 represents, schematically and in a front view, a sixth embodiment of the control device that is the subject of this invention.

It can be seen in FIG. 8 that in the sixth embodiment of the control device that is the subject of this invention, a screen 805 is placed between a plurality of emitters 810 and 815 and a plurality of receivers 820 to 835. The screen 805 is designed to display symbols 840, 845, 850 and 855 either simultaneously or intermittently, e.g. depending on available commands in a given state of an electronic device comprising the control device illustrated in FIG. 8.

In variants, each area of the screen 705 or 805 can only display one symbol. In other variants, the screen 705 or 805 can display different symbols in each area of the screen. In particular, the screen 705 or 805 is preferably a matrix screen; this makes it possible to display symbols made of drawings, icons, letters, numbers or images, which may be animated; the styles and fonts used can vary from one electronic device to another or, in a single electronic device, from one configuration to another or from one country to another.

Generally speaking, in embodiments, a screen is surrounded by at least three emitters and/or receivers; the line segments connecting each emitter to each receiver overlap an area of the screen on which the display means is designed to display a symbol.

Thus, this invention makes it possible to make a touch-screen that functions with no contact between the user's finger and the screen; this has advantages over traditional touch-screens. It should be noted that by using pulsed light sources and means of recognizing the emitted pulses, a matrix touch-screen can be made that is able to discern a number of touch areas equal to the product of the number of emitters by the number of receivers, with these emitters and receivers located around the screen.

Figure 9:
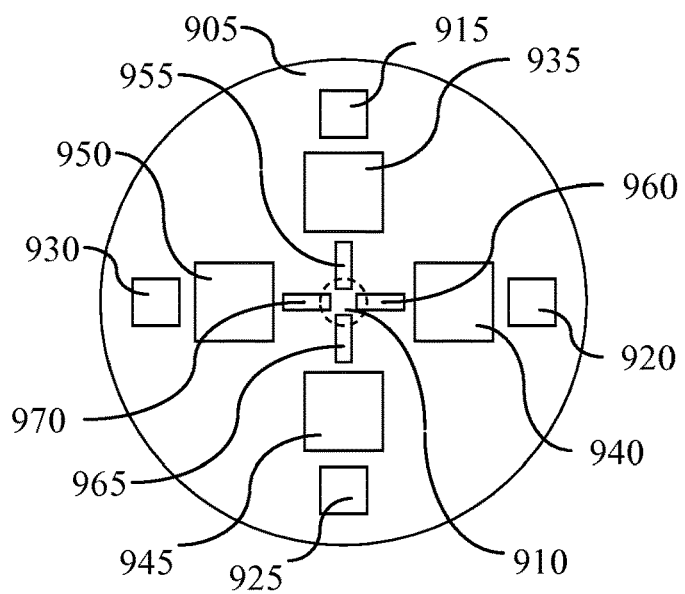
FIG. 9 represents, schematically and in a front view, a seventh embodiment of the control device that is the subject of this invention.

It can be seen in FIG. 9 that in a seventh embodiment 905 of the control device that is the subject of this invention, a central emitter 910 is surrounded by symbols 935 to 950 located between this central emitter 910 and receivers 915 and 930. In this embodiment, the surface of the device 905 is opaque to the wavelengths used, except in front of the receivers 915 to 930. However, in front of the central emitter 910, the surface of the device 905 is at least partially transparent to these wavelengths, on areas 955 to 970, which are elongated in the direction of the receivers 915 to 930, respectively. Thus, the amount of light emitted by the emitter 910 is larger in the direction of the symbols 935 to 950 and of the receivers 915 to 930 than in other directions. Thus, the areas 955 to 970 define masks, whose transparent portion, for at least one wavelength used by the emitter, is elongated in the direction of a receiver able to detect light of said wavelength. These masks, whose transparent portion, for at least one wavelength used by the emitter, are elongated in the direction of a receiver able to detect light of said wavelength. These masks may be rectangular or elliptical, for example, with their longest dimension substantially parallel to the line connecting the emitter and receiver in question. In a variant, such a mask is placed in front of a receiver, possibly combined with such a mask placed in front of an emitter. In FIG. 9, there is only one emitter and four receivers, thus defining four emitter-receiver pairs.

It is here recalled that a "pair", or "couple" is mathematically defined. A pair is an entity (A, B) wherein A and B are any kind of things. Two pairs (A, B) and (C, D) are equal if and only if A=C and B=D. Therefore, two pairs (E, F) and (G, H) are different if E is different from G or F is different from H or both.

Each emitter-receiver pair has a specific mask. Each one mask only belongs to one emitter-receiver pair. This means that if an emitter is coupled to a plurality of receivers, in different pairs, there will be, for said emitter, as many masks as there are receivers and pairs comprising said emitter. Thanks to this provision, the emitters can be switched on permanently (when the display is switched on). The device is more simple, less expensive, has a quicker response time and is more reliable. In Cavallucci (US2004/0246105), the same so-called mask 43 is associated with one receiver ("sensors") P1, P2, . . . but also to all emitter-receiver pair comprising said receiver (See FIG. 4 and paragraph [0065] "Given the interleaved disposition in two parallel rows of the sources and of the sensors, and given the directional nature of the emission from each source, some of the sensors are blind to some of the sources. Thus, the sensors P1 to P3 (FIG. 4) are blind—in transmission—for each of the two sources L1 and L2, While the sensors P4 to P6 are blind for each of the two sources L3 and L4.") Thus, sensor P1 (as well as sensors P2 and P3) receives light from both L3 and L4, with the same mask. Similarly, sensor P4 (as well as sensors P5 and P6) receives light from both L1 and L2. So far, the position of a user's finger cannot be determined. The absence of a mask for each emitter-receiver pair implies that the each emitter must be switched on and off alternatively so that the signal received by the sensor may indicate from which sensor the sensed light is issued. This is also explained in Cavallucci, with regards to FIGS. 4 and 5, and [0063] to [0068], the emitters (light-emitting diodes L1 to L4) have to be switched on and off alternatively because the so-called masks are common to more than one emitter-receiver pair (see FIG. 4). Moreover, a table shown in FIG. 5 is necessary to eliminate polluting signals. For example, paragraph [0066] states: "Consequently, when the light-emitting diode L1 is switched on while the light-emitting diodes L2 to L4 are switched off, for example, the output signals from the sensors P1 to P3 are constituted essentially by noise when the article to be detected in the zone 30 reflects or backscatters little. In order to ensure that the processing of the data that results from converting the signals from the sensors P1 to P6 is not "polluted" with the "noisy" data coming from the sensors P1 to P3, the corresponding signals and/or data are eliminated. This selection is performed by weighting the signals by coefficients of "zero" or of "unity" as shown in the table constituting FIG. 5." Cavallucci's device needs to wait for a complete cycle of switching on and off the LEDs before concluding if there is a finger in front of the display and the position of the finger.

In Cavallucci, the same receiver or sensor (P1 to P6) belongs to two emitter-receiver pairs. For example, P1 belongs to both the emitter-receiver pair "P1-L3" and the emitter-receiver pair "P1-L4".

Therefore, there are two structural differences between Cavallucci and the present invention: In the present invention:
  each mask is associated with only one emitter-receiver pair and
  each receiver is associated with only one emitter.

In Cavallucci, each mask is associated with a plurality of emitter-receiver pairs (e.g., mask 43 surrounding receiver P1 is associated to both P1-L3 et P1-L4 since it allows light coming from both L3 and L4 to enter sensor P1). The emitted light received by the sensor P1 may enter the mask 43 from each one of the emitters L3 or L4.

In FIG. 9, one mask is associated to only one emitter-receiver pair:
  mask 955 with "910-915" pair,
  mask 960 with "910-920" pair,
  mask 965 with "910-925" pair and
  mask 970 with "910-930" pair.

Light entering sensor 915 can only come through mask 955, . . . .

In FIG. 9, each receiver only belongs to one pair (receiver 915 to "910-915" pair, 920 to "910-920" pair, . . . ). Emitted light reaching one receiver can only come from one emitter.

If two of the emitters of Cavallucci are switched on at the same time, the device does not work because it cannot find out the position of the user's finger. The sensor does not differentiate the light reflected on said finger coming from one or the other switched on light sources. To the contrary, if all the emitters of the present device are switched on simultaneously, the position of the finger is determined because only one receiver receives light, thanks to the mask uniquely associated with the emitter-receiver pair.

Figure 12:
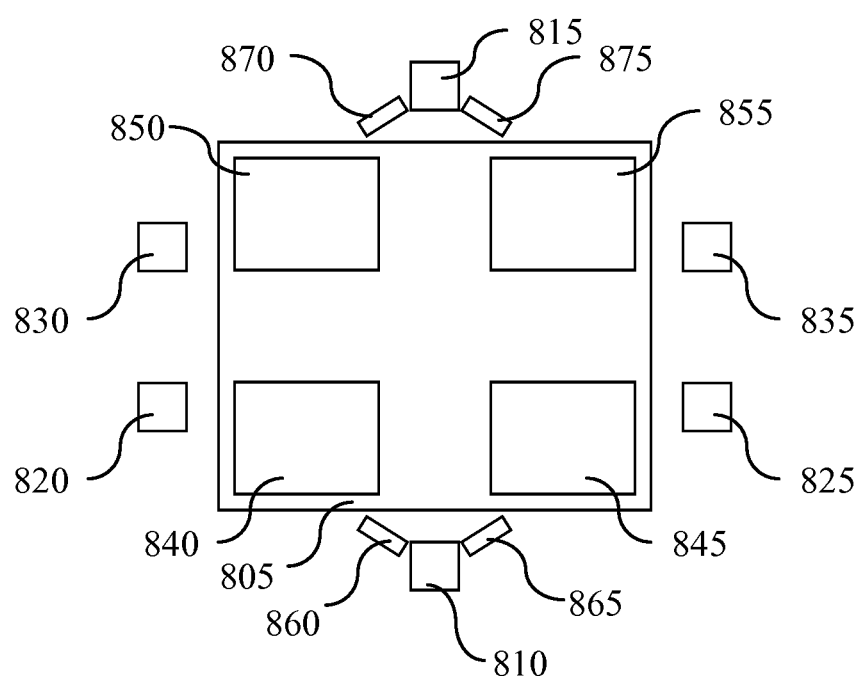
FIG. 12 represents, schematically and in a front view, an eighth embodiment of the control device that is the subject of this invention.

FIG. 12 shows an embodiment combining features of the embodiments shown in FIGS. 8 and 9. All the reference numbers are those of FIG. 8, except the additional masks 860 to 875. In FIG. 12 again, each mask is associated with only one emitter-receiver pair:

the mask 860 is associated solely with the emitter-receiver pair consisting in emitter 810 and receiver 820, the mask 865 is associated solely with the emitter-receiver pair consisting in the emitter 810 and the receiver 825, the mask 870 is associated solely with the emitter-receiver pair consisting in the emitter 815 and the receiver 830, and the mask 875 is associated solely with the emitter-receiver pair consisting in the emitter 815 and the receiver 835.

Preferentially, each mask 860 to 875 is elongated in the direction going from the emitter to the receiver of the same emitter-receiver pair.

For each embodiment, detecting the presence of a finger can be performed in several steps:

determine an average brightness received by the receivers;

detect if a single one of the values of light received exceeds this average and if so, repeat the previous step, e.g. one millisecond later.

If it is again the same receiver alone that receives more than the measured average, it is considered that the corresponding symbol has been selected by the user. Else, return to the first of these steps.

Note that repeating the detection step makes it possible to eliminate debounce phenomena.

Preferably, as described with reference to embodiments described above, each radiation emitter and each radiation receiver is outside each symbol's display area. The make-up of the system is thus simplified and less costly. In particular, the emitters and receivers are not located under the displayed symbols, leading to the advantages described above. In addition, since neither the light emitted by the emitter nor the light received by the receiver go through the symbol, the make-up of the symbol display, whether printed, active or passive, is in no way affected by the technical characteristics of the emitters and receivers.

The various embodiments described above are given as illustrations. Other embodiments are made by combining the embodiments described above. For example, the embodiment illustrated in FIG. 8, in which the line segments connecting each emitter to each receiver overlap an area of the screen on which the display means is designed to display a symbol can combine favorably with the embodiment illustrated in FIG. 9, in which at least one radiation emitter is associated with at least one mask whose transparent portion, for at least one wavelength used by the emitter, is elongated in the direction of a receiver able to detect light of said wavelength.

The description of embodiments of the control device and of its functions define a control method with a device comprising at least one emitter-receiver pair made up of a radiation emitter and a receiver for the radiation emitted by said emitter and reflected by a moving body located at a distance from the pair, within the emission field of said emitter and designed to provide an electrical signal that represents the radiation received from the emitter, characterized in that it comprises, in addition:

a display step, for at least one pair, of at least one symbol that identifies an action, opposite an intersection of said emitter's emission cone with the reception cone of said receiver, with said emitter and said receiver being thus outside the display area of each symbol and a control step that provides action instruction signals depending on the electrical signal provided by at least one said receiver; each emitter-receiver pair is thus associated with at least one symbol and at least one action instruction when the moving body is in front of the symbol that identifies said action.

Figure 13:
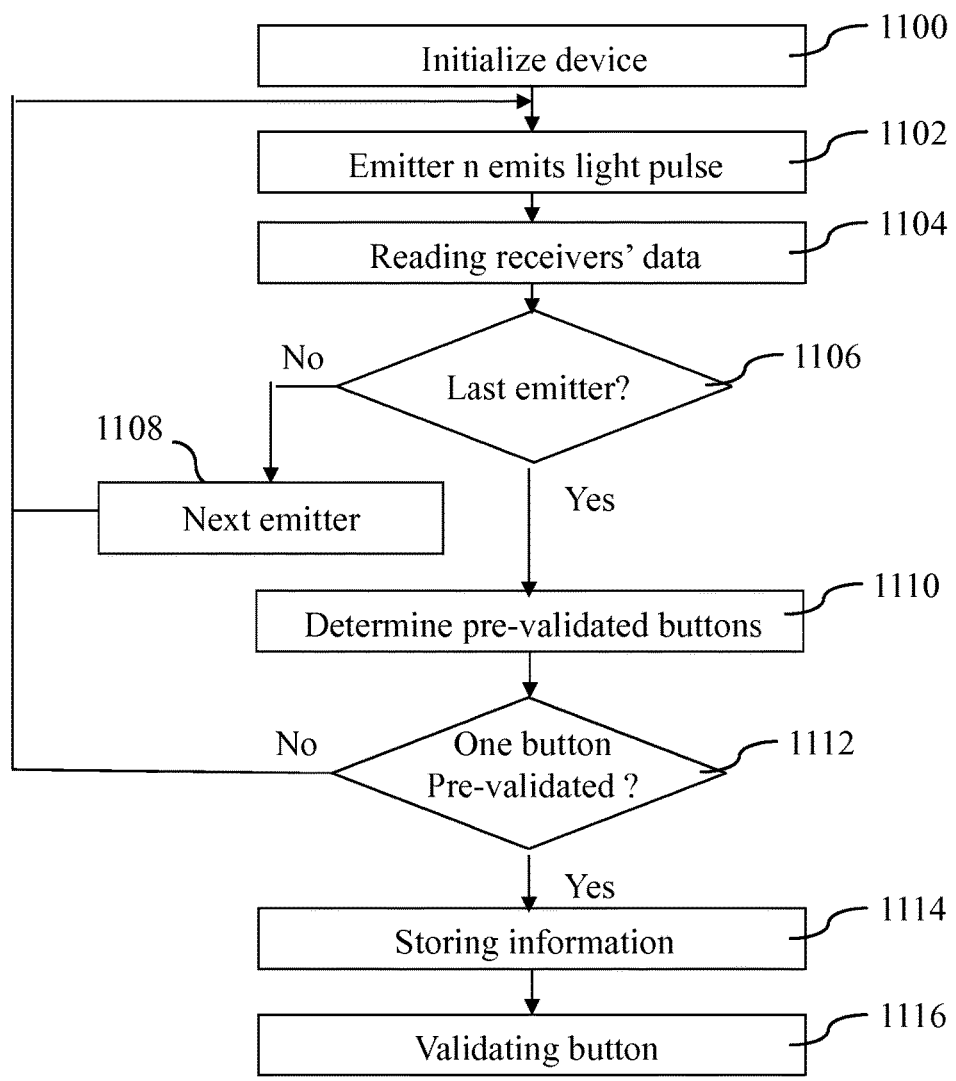
FIG. 13 represents a logical diagram of steps utilized by the control device shown in FIGS. 14 to 17.

FIG. 13 shows steps of an embodiment of a process for detecting the position of a finger in front of a display according to the present invention.

During step 1100, the device is initialized. During step 1102, an emitter n (beginning with the first emitter) emits a light pulse. All the output signals from all the receivers (or sensors) are read during step 1104.

During step 1106, it is determined if the last emitter has emitted a light pulse. If not, during step 1108, the next emitter is selected and step 1102 is performed again. Otherwise, during step 1110, for each receiver, it is determined the output signal has reached a predefined level. If yes, the corresponding button on the display is pre-validated. Otherwise said button is not pre-validated.

During step 1112, it is determined if one and only one button is pre-validated. If not and if at least two buttons are pre-validated, step 1102 is performed again, after a predefined time, beginning with the first emitter. If no and if no button is pre-validated, step 1102 is immediately performed again, beginning with emitter 1.

If it is determined that one and only one button is pre-validated, during step 1114 the information that this button is pre-validated is stored in a memory and a timer is launched, only if the same information is not already stored in said memory. At the end of the timer, step 1102 is performed again, beginning with the first emitter, and steps 1104 to 1112 are also performed.

If the same information is already stored in the memory, the button is validated during step 116, meaning that the action associated with said button is performed.

Figure 14:
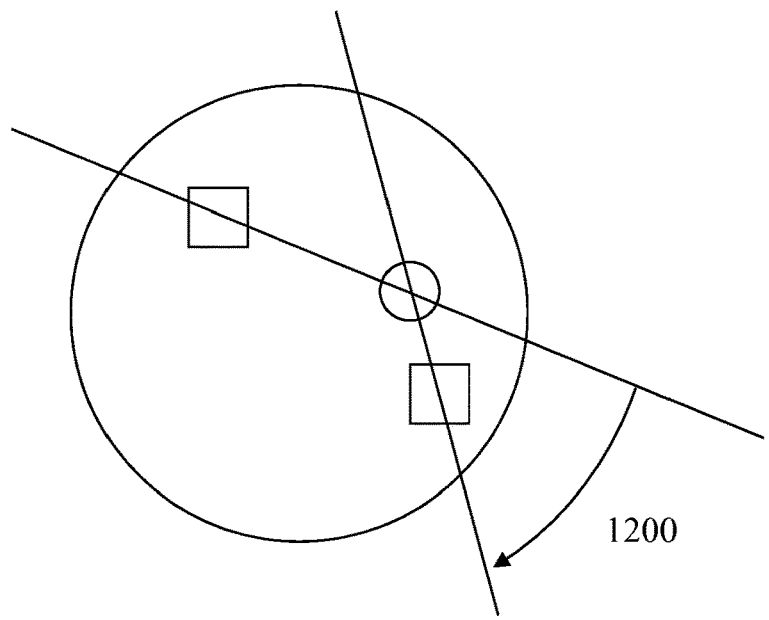
FIG. 14 represents, schematically and in front view, a ninth embodiment of the control device that is the subject of this invention.

FIG. 14 shows an asymetrical configuration of a circular display (and button) 1200 used in embodiments of the present invention. One emitter 1205 is asymmetrically surrounded by two receivers 1210 and 1215. As can be seen in FIG. 14, the receivers 1210 and 1215 are not at the same distance from the emitter 1205. The receivers 1210 and 1215 are not at the same distance from the center 1220 of the display (and button) 1200. Moreover, the receivers 1210 and 1215 and the emitter 1205 are not on the same straight line. Furthermore, the emitter 1205 is not at the center 1220 of the display (and button). And none of the receivers 1210 and 1215 are at the center 1220 of the display (and button).

Figure 15:
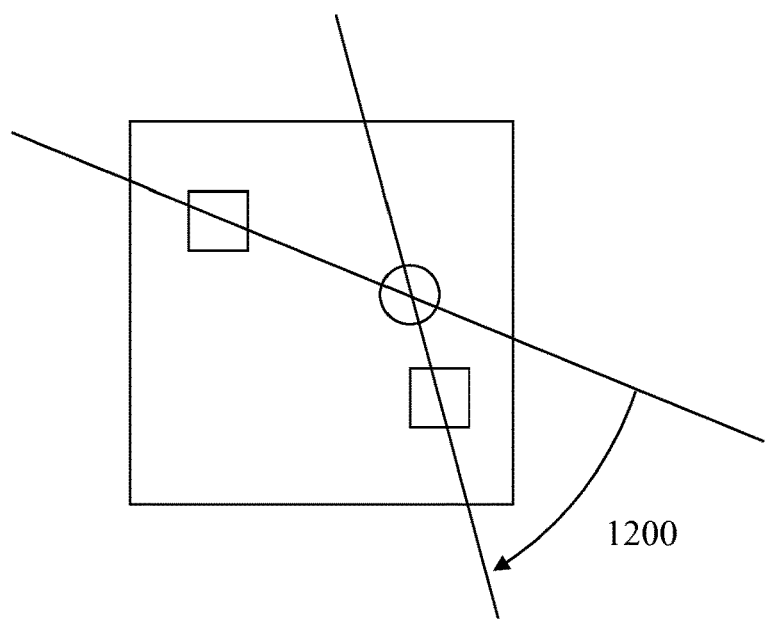
FIG. 15 represents, schematically and in front view, a tenth embodiment of the control device that is the subject of this invention.

FIG. 15 shows an asymetrical configuration of a square display (and button) 1300 used in embodiments of the present invention. One emitter 1305 is asymmetrically surrounded by two receivers 1310 and 1315. As can be seen in FIG. 15, the receivers 1310 and 1315 are not at the same distance from the emitter 1305. The receivers 1310 and 1315 are not at the same distance from the center 1320 of the display (and button) 1300. Moreover, the receivers 1310 and 1315 and the emitter 1305 are not on the same straight line. Furthermore, the emitter 1305 is not at the center 1320 of the display (and button). And none of the receivers 1310 and 1315 is at the center 1320 of the display (and button).

Figure 16:
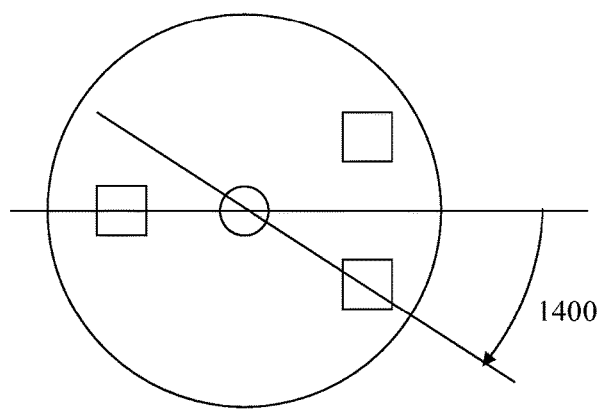
FIG. 16 represents, schematically and in front view, a eleventh embodiment of the control device that is the subject of this invention.

FIG. 16 shows an asymetrical configuration of a square display (and button) 1400 used in embodiments of the present invention. One centered emitter 1405 is asymmetrically surrounded by three receivers 1410, 1415 and 1420. As can be seen in FIG. 16, the receivers 1410 to 1420 are not at the corners of an isosceles triangle.

Figure 17:
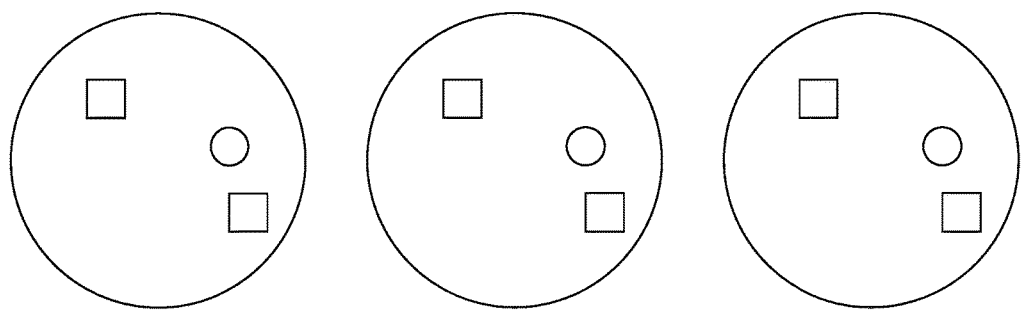
FIG. 17 represents, schematically and in front view, a combination of three control devices represented in FIG. 14.

FIG. 17 shows three displays (and buttons) 1505, 1510 and 1515 in a row. These displays (and buttons) are, each, similar to button 1200 shown on FIG. 14.

The positioning of the receivers is designed so that the receivers of the next display (and button) may receive light from the emitter of the previous display (and button) that is reflected on a finger. Thanks to this feature, a triangulation may be performed to more accurately determine the position of the finger.

This configuration has many advantages:

An object (generally, a finger) may be more easily detected an the area above the button. Moreover, false detection may be more easily detected when two buttons are pre-activated (see FIG. 13).

The invention claimed is:

1. Control device having a flat surface and comprising:
a plurality of emitter-receiver pairs on one side of said flat surface wherein each emitter-receiver pair includes a radiation emitter to emit radiation and a receiver to receive the radiation emitted by the radiation emitter and reflected by a moving object located on another side of said flat surface at a distance from said flat surface, the receiver providing an electrical signal representative of the radiation received from the radiation emitter and reflected on the moving object remote from said flat surface;
for each said emitter-receiver pair, a display configured to display at least one symbol identifying an action of said at least one emitter-receiver pair and opposite an intersection of an emission cone of the radiation emitter and a reception cone of the receiver, wherein said intersection is remote from said flat surface and the radiation emitter and the receiver are outside a display area of each symbol,
wherein the intersections of emissions cone and reception cone of different emitter-receiver pairs are remote from each other and remote from said flat surface, so that the moving object touching said flat surface does not reflect light emitted by an emitter to a receiver;
wherein each said emitter-receiver pair is associated with said at least one symbol and at least one action control signal when the moving object in the intersection is in front of the symbol identifying the action;
wherein at least one of the radiation emitter or the receiver is associated with at least one mask, whose transparent portion, for at least one wavelength used by the radiation emitter, is elongated in the direction of the receiver configured to detect a light of said at least one wavelength and limits the emission cone or the reception cone, respectively;
wherein the flat surface of the control device is opaque to wavelengths emitted by the radiation emitter and received by the receiver except in front of each mask and,
a controller configured to provide action control signals according to the electrical signal provided by the receivers.

2. The control device of claim 1, wherein each receiver belongs to only one emitter-receiver pair.

3. The control device of claim 1, wherein the display is configured to display said at least one symbol on a screen.

4. The control device of claim 1, wherein the display area of said at least one symbol is surrounded by at least three emitters and receivers; and wherein segments of lines connecting each emitter to each receiver overlap an area for displaying a symbol.

5. The control device of claim 1, wherein the controller comprises a processor configured to eliminate the impact of ambient light not reflected by the moving object.

6. The control device of claim 1, wherein at least one radiation emitter is configured to emit the radiation in an intermittent manner; wherein the controller comprises a processor configured to store an electrical signal level received from each receiver when the radiation emitter is not emitting any radiation; and wherein the action control signals depend on an instantaneous radiation received and on the stored electrical signal level.

7. The control device of claim 1, wherein the controller is configured to provide an output signal modulated according to a magnitude of a stimulus.

8. The control device of claim 1, further comprising a means of communication to receive or transmit the action control signals remotely.

9. The control device of claim 1, wherein, in said at least one emitter-receiver pair, a light emission axis of the radiation emitter and a light reception axis of the receiver are convergent.

10. The control device of claim 1, wherein the display is configured to display, for said at least one emitter-receiver pair, said at least one symbol identifying an action; wherein an axis perpendicular to a plane bears said symbol and rests within a convex area defined by an intersection of said symbol with at least one of the following: an emission axis of the emitter or a reception axis of the receiver.

11. The control device of claim 1, wherein an object placed in contact with the display area that does not reflect any radiation emitted by the emitter in a direction of the receiver is not detected.

12. The control device of claim 10, wherein the object is a finger placed in contact with the display area.

13. Electronic device configured to realize actions and comprising the control device of claim 1 to control at least one said actions.

* * * * *